(12) United States Patent
Moon

(10) Patent No.: US 6,300,175 B1
(45) Date of Patent: Oct. 9, 2001

(54) METHOD FOR FABRICATING THIN FILM TRANSISTOR

(75) Inventor: Dae-Gyu Moon, Anyang-shi (KR)

(73) Assignee: LG. Philips LCD., Co., Ltd., Seoul (KR)

( * ) Notice: Subject to any disclaimer, the term of this patent is extended or adjusted under 35 U.S.C. 154(b) by 0 days.

(21) Appl. No.: 09/311,701

(22) Filed: May 13, 1999

(30) Foreign Application Priority Data

Jun. 9, 1998 (KR) .................................................. 98-21288

(51) Int. Cl.[7] .............................. H01L 21/00; H01L 21/84

(52) U.S. Cl. .......................... 438/158; 438/151; 438/166

(58) Field of Search .................................... 438/158, 166, 438/142, 149, 151

(56) References Cited

U.S. PATENT DOCUMENTS

| | | | |
|---|---|---|---|
| 5,432,122 | 7/1995 | Chae | 438/157 |
| 5,496,768 | 3/1996 | Kudo | 438/487 |
| 5,585,647 | * 12/1996 | Nakajima et al. | 257/72 |
| 5,696,388 | 12/1997 | Funada et al. | 257/64 |
| 5,767,003 | 6/1998 | Noguchi | 438/487 |
| 5,817,548 | 10/1998 | Naguchi et al. | 438/160 |
| 5,858,807 | 1/1999 | Kawamura | 438/30 |
| 6,177,301 | * 1/2001 | Jung | 438/150 |

FOREIGN PATENT DOCUMENTS

| | | |
|---|---|---|
| 0 141 506 | 5/1985 | (EP) . |
| 0 178 447 | 4/1986 | (EP) . |
| 0 456 199 | 11/1991 | (EP) . |
| 7-99314 | 4/1995 | (JP) . |
| 9-260684 | 10/1997 | (JP) . |
| 97/45827 | 12/1997 | (WO) . |
| WO 97/45827 | 12/1997 | (WO) . |

OTHER PUBLICATIONS

Poate et al., Laser Annealing of Semiconductors, (Academic Press, New York, 1982), pp. 45–46.*
Robert S. Sposili, et al., Sequential lateral solidification of thin silicon films on $SiO_2$, Appl. Phyus. Lett. 69 (19), Nov. 4, 1996, pp. 2864–2866.
James S. Im, et al., Single–crystal Si films for thin–film transistor devices, Appln. Phys. Lett. 70 (25), Jun. 23, 1997, pp. 3434–3436.
James S. Im, et al., Crystalline Si Films for Integrated Active–Matrix Liquid–Crystal Displays, MRS Bulletin, Mar. 1996, pp. 39–48.
James S. Im, et al., Single Crystal Silicon Films Via a Low–Substrate–Temperature Excimer–Laser Crystallization Method, MRS Abstract 1996 Fall Meeting.

(List continued on next page.)

*Primary Examiner*—Andrew Tran
*Assistant Examiner*—Christian D. Wilson
(74) *Attorney, Agent, or Firm*—Long, Aldridge & Norman LLP

(57) ABSTRACT

A method of fabricating a thin film transistor includes crystallizing an amorphous silicon layer having a sloping surface and a flat surface by an SLS technique using a laser beam having predetermined energy density so as to melt the sloping surface as well as the flat surface of the amorphous silicon layer to form a crystallized silicon layer and forming the active layer by selectively etching the crystallized silicon layer. The laser beam is applied non-vertically to the sloping surface while the laser beam is applied vertically to the flat surface. Although the sloping surface and the flat surface of the amorphous silicon layer are irradiated with a laser beam having the same laser energy density, the absorbed energy density of the sloping surface may be lower than that of the flat surface. The laser beam generates a first energy density to substantially melt the sloping surface and a second energy density to substantially melt the flat surface of the amorphous silicon. The amorphous silicon layer is irradiate with the laser beam having the first energy density to substantially melt both the sloping and flat surfaces.

17 Claims, 7 Drawing Sheets

OTHER PUBLICATIONS

J.P. Leonard, et al., The Effect of Film Thickness and Pulse Duration Variation in Excimer Laser Crystallization of Thin Si Films, Mat. Res. Soc. Symp. Proc. vol. 452, pp. 947–952, 1997.

R.S. Sposili, et al., Single–Crystal Si Films Via a Low–Substrate–Temperature Excimer–Laser Crystallization Method, Mat. Res. Soc. Symp. Proc. vol. 452, pp. 953–958, 1997.

J.S. Im, et al., Single–Crystal Si Films for Thin–film Transistor Devices, Appl. Phys. Lett. 70 (25), pp.3434–3436, Jun. 23, 1997.

M.A. Crowder, et al., Low–Temperature Single–Crystal Si TFTs Fabricated on Si Films Processed Via Sequential Lateral Solidification, IEEE Electron Device Letters, pp. 1–3, Sep. 1997.

J.S. Im., et al., Controlled Super–Lateral Growth of Si Films for Microstructural Manipulation and Optimization, Physics Status Solid, pp. 1–7 w/8 pages of figures, Feb. 22, 1998.

* cited by examiner

METHOD FOR FABRICATING THIN FILM TRANSISTOR

BACKGROUND OF THE INVENTION

1. Field of the Invention

The present invention is related to a method for fabricating Thin Film Transistor (TFT), and more particularly, to a method for fabricating TFT, of which an active layer is formed by crystallizing a silicon thin film, using Sequential Lateral Solidification (SLS).

2. Description of Related Art

In order to fabricate TFTs on a low heat-resistant substrate, such as a glass substrate, an amorphous silicon layer or a polycrystalline silicon layer is deposited on the substrate and is etched by photolithography to form active layers for TFTs.

The mobility of a carrier is low in the amorphous silicon layer. Accordingly, amorphous silicon TFT is difficult to be used as a device for driving circuits of a liquid crystal display (LCD). However, the mobility of a carrier is high in the polycrystalline layer. Accordingly, polycrystalline TFT could be used as a device for driving circuits of a liquid crystal display (LCD), in which devices for pixel array and a device for driving circuits are formed simultaneously.

There are two techniques to form polycrystalline silicon film on a glass substrate. In the first technique, an amorphous silicon film is deposited on the substrate and is crystallized under a temperature of 600 C by Solid Phase Crystallization (SPC). The first technique needs a high temperature process. Therefore, it is difficult to form the polycrystalline silicon film layer on the glass substrate by the first technique.

In the second technique, an amorphous silicon film is deposited on the substrate and is crystallized by thermal treatment using a laser. The second technique does not require a high temperature process. Therefore, the second technique is applied to form a polycrystalline silicon film on the glass substrate.

FIG. 1A to FIG. 1E are schematic drawings for explaining a method for fabricating a TFT according to the prior art.

Referring to FIG. 1A, a source electrode 11S and a drain electrode 11D are formed on an insulating substrate 100. And an amorphous silicon layer 12 is deposited on the exposed surface of the substrate comprising the source electrode 11S and the drain electrode 11D. The amorphous silicon layer 12 has steps and sloping surfaces, since the amorphous silicon layer 12 covers the protruding source and drain electrodes 11S and 11D.

Referring to FIG. 1B, the amorphous silicon layer is crystallized into a polycrystalline silicon layer 13 by carrying out a crystallization procedure using laser annealing. The method for crystallizing the amorphous silicon layer into the polycrystalline silicon layer 13 by applying a laser beam to the amorphous silicon layer is described as follows.

An active layer of the TFT is formed by the polycrystalline silicon layer having large silicon grains to decrease the effect of the grain boundary which prevents carriers from passing through the channel.

A selected region of the amorphous silicon layer is first irradiated with an energy density to induce separated islands of amorphous silicon, remaining. The other regions undergo complete melting. The amorphous film is translated or moved relative to the laser beam over a distance less than a predetermined distance for a second irradiation. While the film is translating, the separated islands of amorphous silicon are used as seeds and grow into the molten silicon region, to form a first polycrystalline silicon region. Herein, grain growth occurs from the interface between the liquid silicon region and the solid state amorphous silicon region into the liquid silicon region. This grain growth stops by making grain boundary when each grain collides. The above-described process of irradiating and crystallizing is repeated over a total translation distance to crystallize the majority of the film.

Referring to FIG. 1C, the polycrystalline silicon layer is etched by photolithography to form an active layer 14. Referring to FIG. 1D, a gate insulating interlayer 15 and a gate electrode 16 are formed on the active layer 14. Source and drain regions 14S and 14D are then formed in the active layer 14 by doping impurities in the exposed portions of the active layer 14. The channel region 14C is formed between the source and the drain regions 14S and 14D.

Referring to FIG. 1E, a passivation layer 17 is deposited on the exposed surface of the substrate and is etched selectively to expose a portion of the drain electrode 11D. And a pixel electrode 18 is formed connecting the exposed portion of the drain electrode 14D on the passivation layer 17.

However, since the size of each silicon grain is non-uniform and the location of grain boundary is random in the active layer, device-to-device uniformity is low in TFTs fabricated according to the prior art. Therefore, the polycrystalline silicon layer connot be applied to form devices having complicated circuits, while a single crystal silicon film could be applied to form such device.

SUMMARY OF THE INVENTION

Accordingly, the present invention is directed to a method for crystallizing an amorphous silicon layer and a method for fabricating a TFT, that substantially obviates one or more of the problems due to limitations and disadvantages of the prior art.

Another object of the present invention is to provide a method for fabricating a TFT, the active layer of which is formed by crystallizing a silicon thin film, using steps by Sequential Lateral Solidification (SLS).

A further object of the present invention is to provide a method for fabricating a TFT, the active layer of which is formed by using a large single silicon grain.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention, a method for fabricating a TFT having an active layer formed by crystallizing an amorphous silicon layer, comprises forming the active layer having sloping and flat surfaces by selective etching of the crystallized silicon layer; crystallizing the amorphous silicon layer by SLS technique, using a laser beam having energy density so as to melt the sloping surface as well as the flat surface of the amorphous silicon layer.

In another aspect of the present invention, a method for fabricating a TFT comprises steps of: forming source and drain electrodes on a substrate; depositing an amorphous silicon layer on the exposed portion of the substrate comprising the source and the drain electrodes; crystallizing the amorphous silicon layer by SLS technique; forming an active layer by etching the crystallized silicon layer through photolithography; forming a gate electrode and a gate insulating layer on the active layer; and forming source and drain regions in the active layer by doping impurities selectively in the exposed portion of the active layer.

In another aspect of the present invention, a method for fabricating a TFT, comprising steps of: forming a gate electrode on a substrate; forming a gate insulating layer on the exposed portion of the substrate comprising the gate electrode; depositing an amorphous silicon layer on the exposed portion of the gate insulating layer; crystallizing the amorphous silicon layer by SLS technique; forming an active layer by etching the crystallized silicon layer through photolithography; and forming source and drain electrodes connecting the active layer electrically.

BRIEF DESCRIPTION OF THE DRAWINGS

The accompanying drawings, which are included to provide a further understanding of the invention and are incorporated in and constitute a part of this application, illustrate embodiments of the inventing and together with the description serve to explain the principle of the invention.

DETAILED DESCRIPTION OF THE PREFERRED EMBODIMENTS

Reference will now be made in detail to the preferred embodiment of the present invention, an example of which is illustrated in the accompanying drawings.

Figure 1A:
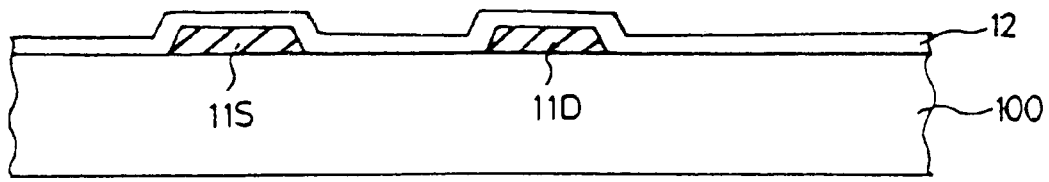
FIGS. 1A to 1E are schematic drawings of a TFT according to prior art.
Figure 1B:
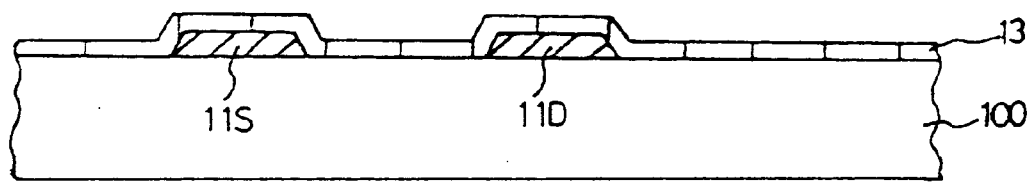
Figure 1C:
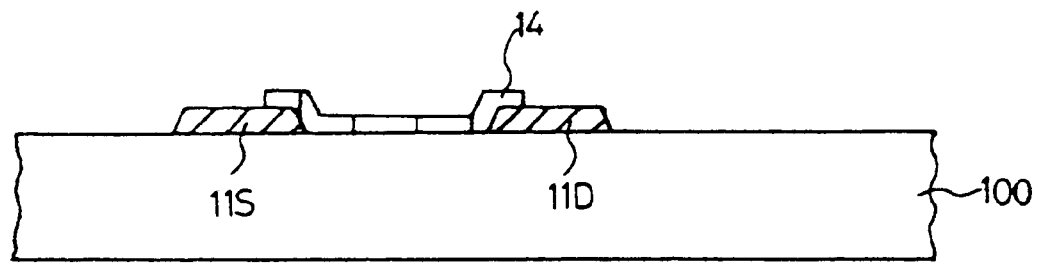
Figure 1D:
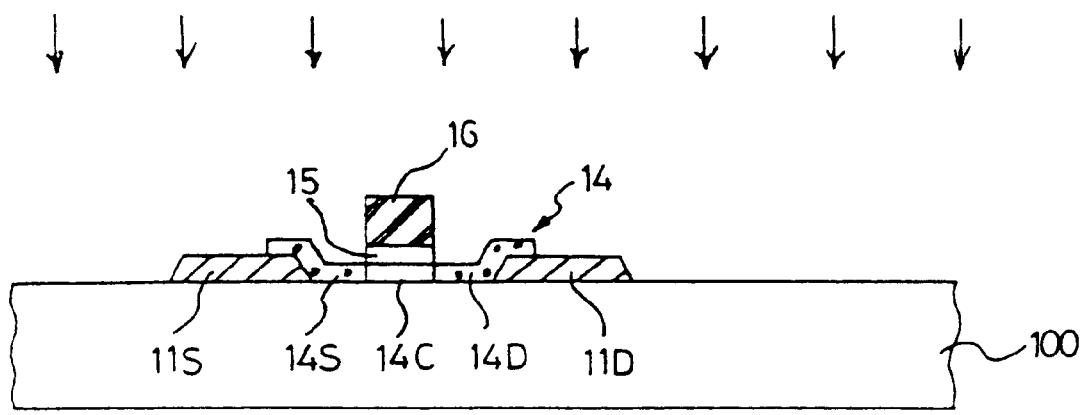
Figure 1E:
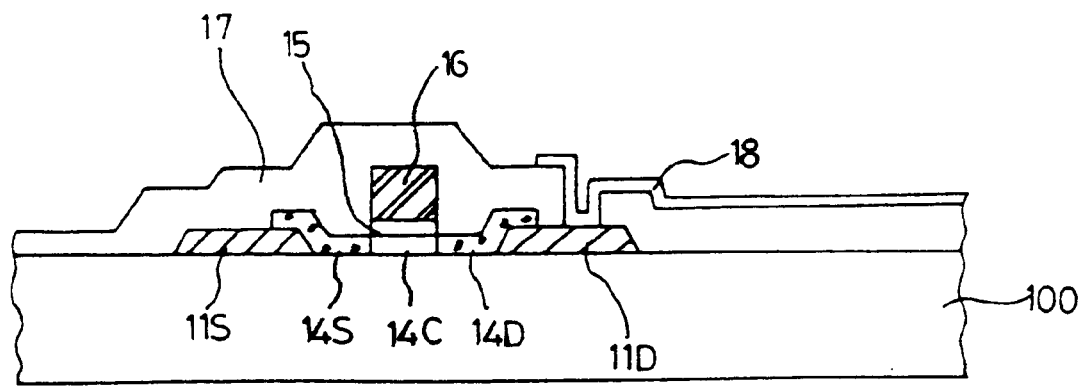
Figure 2A:
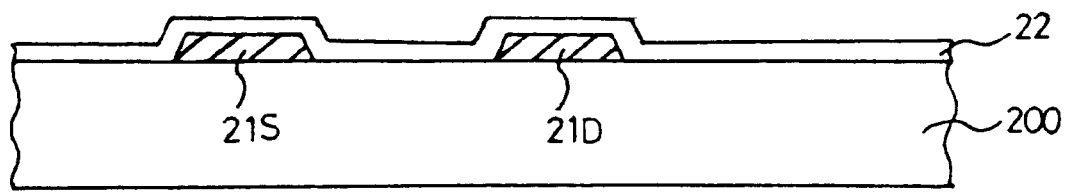
FIGS. 2A to 2E are schematic drawings of a TFT according to a first embodiment of the present invention.

FIG. 2A to FIG. 2D are schematic drawings for explaining a method for fabricating a TFT according to a first embodiment of the present invention. Referring to FIG. 2A, a source electrode 21S and a drain electrode 21D are formed on a insulating substrate 200. An amorphous silicon layer 22 is then deposited on the exposed surface of the substrate comprising the source electrode 11S and the drain electrode 21D. The amorphous silicon layer 22 has steps and sloping surfaces, since the amorphous silicon layer covers the protruding source and drain electrodes 21S and 21D.

Figure 2B:
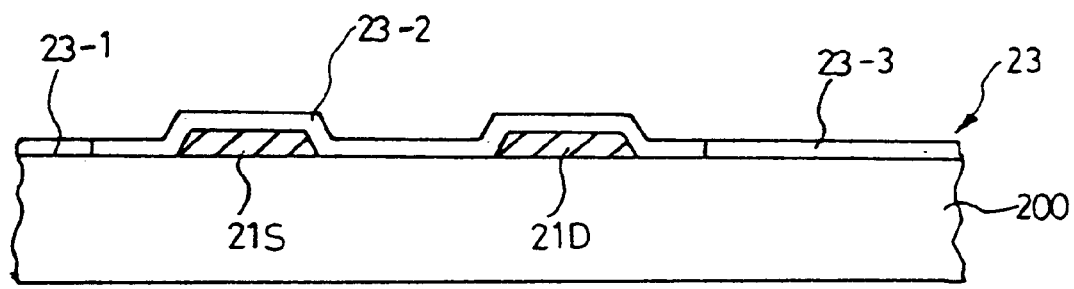

Referring to FIG. 2B, the amorphous silicon layer 22 is crystallized into a polycrystalline silicon layer 23 by using a sequential lateral solidification (SLS) technique. The polycrystalline silicon layer has long columnar silicon grains.

Figure 3:
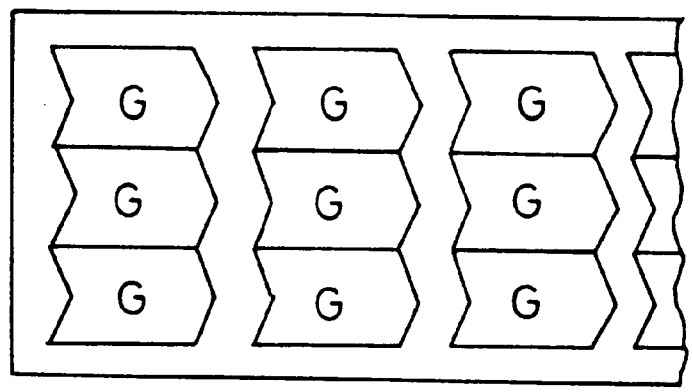
FIGS. 3 to 5 are schematic drawings of a three silicon layer crystallized by SLS technique.
Figure 4:
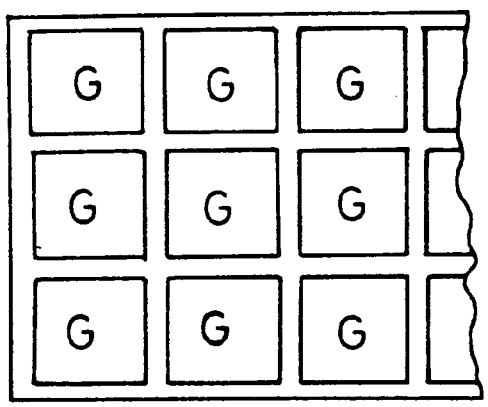
Figure 5:
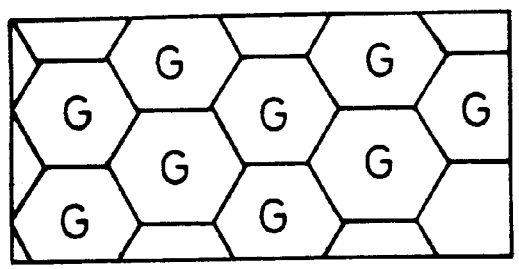

The SLS technique uses a phenomenon whereby the grain boundaries in directionally solidified materials tend to form so as to always be approximately perpendicular to the melt interface. The SLS technique enables the conversion of as-deposited amorphous or polycrystalline silicon films to a directionally solidified microstructure consisting of long, columnar grains (Robert S. Sposilli, M. A. Crowder, and James S. Im, Mat. Res. Soc. Symp. Proc. Vol. 452, 956~957, 1997). Referring to FIG. 3 to FIG. 5, the method for crystallizing the amorphous silicon layer into the polycrystalline silicon layer by SLS technique is described as follows. For convenience of describing such technique, three techniques of the SLS method are taken as examples.

SLS is a technique that forms the silicon layer, by applying laser to an amorphous silicon layer. Here, the displacement of the laser beam is shorter than the length of lateral growth of the crystal. Consequently, silicon particles which are longer than 10 µm are formed on a glass substrate. The foregoing technique is disclosed in "Crystalline Si Films For Integrated Active Matrix Liquid-Crystal Displays," MRS Bulletin, Volume XXI, Number 3, March 1996, pp. 39~48.

Moreover, the location, size, and shape of a crystal particle may be controlled by manipulating the shape of a slit through which a laser beam passes, which enables the formation of silicon particles that are larger than an active area of a TFT. Thus, it is possible to fabricate a TFT of single crystalline silicon manufactured by forming an active area of the TFT as a single crystal particle.

FIG. 3 is schematic drawings for explaining the method for crystallizing the silicon film having large silicon grains according to a first example of the SLS technique. A plurality of the selected region preferably having a chevron-shaped apertures having a round apex of the film are irradiated at an energy density sufficient to induce complete melting. Subsequently, lateral grain growth proceeds from the unmelted regions adjacent to the narrow strip to the fully-melted regions. The grain boundaries in directionally solidified materials tend to form so as to always be approximately perpendicular to the melt interface. Here, the grains formed at the apex of the chevron experience lateral growth not only in the translation direction, but also transverse to it, due to the fact that grain boundaries form roughly perpendicular to the melt interface. Thus, the negative curvature of the molten zone at the apex of the chevron leads to widening of the grain, such that a single crystal silicon grain region is induced.

The film is translated relative to the beam image over a distance less than the single-pulse lateral growth distance, such as approximately one-half of the single-pulse lateral growth distance, and irradiated again. Lateral growth recommences from the edges of the completely molten region, one of which is located within the grains grown during the previous irradiation step. The length of the grains is increased beyond the single-pulse lateral growth distance. Here, the grain formed at the apex of the chevron, a single crystal silicon region, widens. The above process of irradiating and solidifying can be repeated indefinitely, leading to grains of any desired length. The final structure obtained in this fashion is shown in FIG. 3. The grain formed at the apex of the chevron, a single crystal silicon region, widens dramatically.

FIG. 4 is schematic drawings for explaining the method for crystallizing the silicon film having large silicon grains according to a second example of the SLS technique. A plurality of the selected narrow regions having a directionally straight slit shape of the film in a row are irradiated at an energy density sufficient to induce complete melting. Subsequently, lateral grain growth having a columnar direction proceeds from the unmelted regions adjacent to the narrow strips to the fully-melted regions. The grain boundaries in directionally solidified materials tend to form so as to always be approximately perpendicular to the melt interface. And the film is translated relative to the beam image over a distance less than the single-pulse lateral growth distance, and irradiated again. Lateral growth recommences from the edges of the completely molten region, one of which is located within the grains grown during the previous irradiation step. The length of the grains is increased beyond the single-pulse lateral growth distance. The above process of irradiating and solidifying can be repeated indefinitely, leading to grains of any desired length.

Then, a plurality of the columnar directional selected straight regions of the crystallized silicon film having columnar grains are irradiated. The columnar direction is perpendicular to the row direction. Subsequently, lateral grain growth proceeds to the row direction from the unmelted regions adjacent to the narrow strips to the fully-melted regions, by using one of the first direction columnar grains as seed for grain growth. The grain boundaries in directionally solidified materials tend to form so as to always be approximately perpendicular to the melt interface. The above process of irradiating and solidifying can be repeated indefinitely, leading to grains of any desired length. As the lateral grain growth in the row direction proceeds, the seed grain grows more and more. A plurality of the seed grain grows dramatically to form a plurality of the single crystalline region G as the result of the crystallization. Thereby, crystallized silicon film having very large size of the single crystalline regions can be formed on the glass substrate.

FIG. 5 is a schematic drawing for explaining the method for crystallizing the silicon film having large silicon grains according to a third example of the SLS technique. A portion, except a plurality of selected dot regions, is first irradiated with an energy density sufficient to induce complete melting. The amorphous film is translated relative to the laser beam to a first direction over a distance less than one pulse lateral grain growth for second irradiating. While the film is translating, the unmelted dot region of the amorphous silicon is used as seeds and grows into the fully-melted regions. The grain boundaries in directionally solidified materials tend to form so as to always be approximately perpendicular to the melted interface. In addition, a portion, except a plurality of selected dot regions, is irradiated a second time with at an energy density sufficient to induce complete melting. Here the dot region is located in the crystallized silicon region.

The dot region which is not irradiated remains in a solid state of the polycrystalline silicon and has a limited number of silicon grains. The amorphous film is translated relative to the laser beam to a second direction over a distance less than one pulse lateral grain growth for third irradiating. While the amorphous film is being translated, the unmelted dot region of the polycrystalline silicon having three grains is used as seed and grows into the fully-melted regions. A portion, except a plurality of the selected dot regions, is irradiated for a third time with an energy density sufficient to induce complete melting.

Here the dot region is located in the crystallized silicon region. The dot region which is not irradiated remains in a solid state of the polycrystalline silicon and has a limited number of silicon grains relative to the previous step. Accordingly, as the above process is further carried out, the number of grains in the dot region is reduced. Finally, only a single grain remains in the dot region when an appropriate number of the above process is carried out.

The size of the single crystalline silicon region is the same as the lateral grain growth. The length of the lateral grain growth depends on the thickness of the film and the temperature of the film. Accordingly, the size of the single crystalline silicon region could be controlled according to the thickness and the temperature of the film. When the distance between the dots is smaller than the length of the lateral grain growth, the polycrystalline silicon film has a plurality of the single crystalline silicon region with grain boundary at the interface of the silicon grain and the silicon grain.

Referring to FIG. 2B, the amorphous silicon layer 22 is crystallized by the SLS technique as described above. A crystallized silicon thin film 23 having a dramatically large first silicon grain 23-1, a second silicon grain 23-2 and a third silicon grain 23-3 are shown in FIG. 2B. Here, the shape and translation distance of the laser beam must be controlled so that the boundaries of the grain to the grain is preferably not located in an active layer of the TFT which will be formed.

The laser beam is applied non-vertically to the sloping surface while the laser beam is applied vertically to the flat surface. Although the sloping surface and the flat surface of the amorphous silicon layer are irradiated with a laser beam having the same laser energy density, the absorbed energy density of the sloping surface may be lower or higher than that of the flat surface. According, it is necessary to use a laser beam having an energy density so as to melt the sloping surface as well as the flat surface of the amorphous silicon layer. For example, when the sloping surface of the amorphous silicon layer could be melted with laser beam having a first energy density or more and the flat surface of the amorphous silicon layer could be melted with laser beam having a second energy density or more, it is necessary to use a laser beam having the higher energy density of the two energy density, the first energy density and the second energy density so as to melt the sloping surface as well as the flat surface of the amorphous silicon layer.

The necessary laser energy density is in proportion to the angle of the inclination of the amorphous silicon surface. The present invention is effectively applied to the case in which the silicon layer having sloping portions with 45 degrees or less of the inclination angle is formed.

Figure 2C:
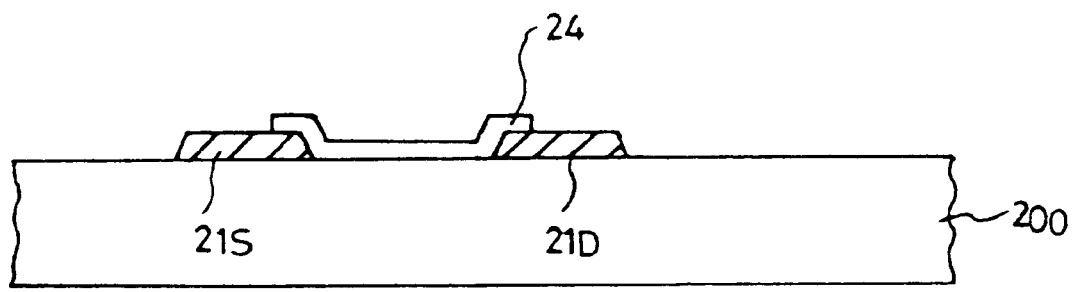

Referring to FIG. 2C, the crystallized silicon thin film is etched by photolithography to forman active layer 24. Since the first silicon grain, the second silicon grain and the third silicon grain are dramatically large, the active layer is formed within one single silicon grain, particularly in the second silicon grain 23-2. Accordingly, a single crystalline silicon TFT can be fabricated on the insulating substrate, such as a glass substrate.

Figure 2D:
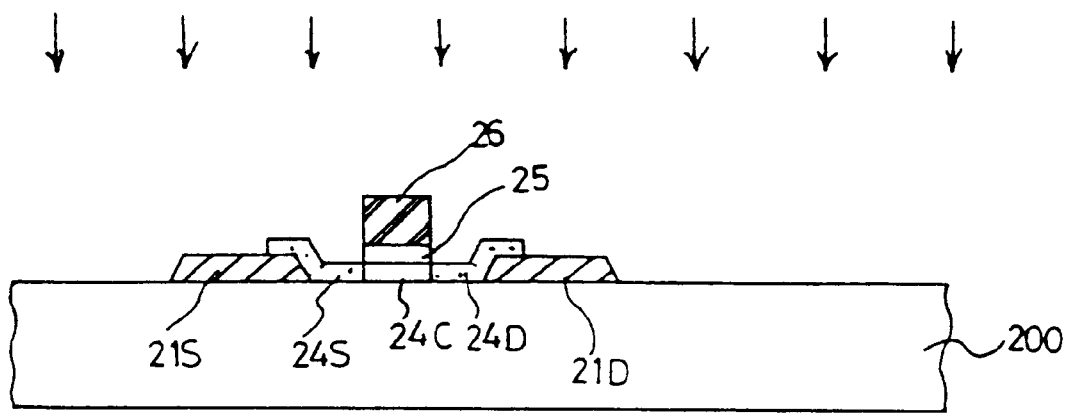

Referring to FIG. 2D, a gate insulating interlayer 25 and a gate electrode 26 are formed on the active layer. Then, a source region 24S and a drain region 24D are formed in the active layer by doping impurities in the exposed portions of the active layer. The channel region 24C is formed between the source region and the drain region.

Figure 2E:
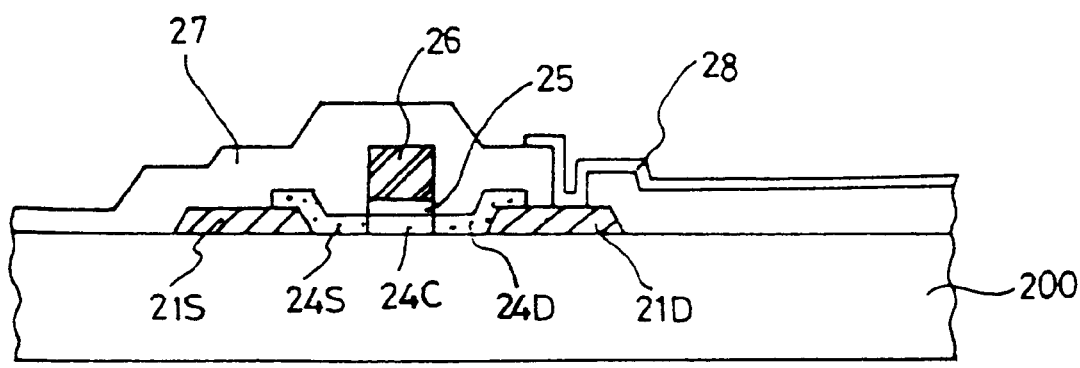

Referring to FIG. 2E, a passivation layer 27 is deposited on the exposed surface of the substrate and is etched selectively to expose a portion of the drain region 24D. And a pixel electrode 28 is formed connecting the exposed portion of the drain electrode on the passivation layer.

FIG. 6A to FIG. 6D are schematic drawings for explaining a method for fabricating a TFT according to a second embodiment of the present invention.

Figure 6A:
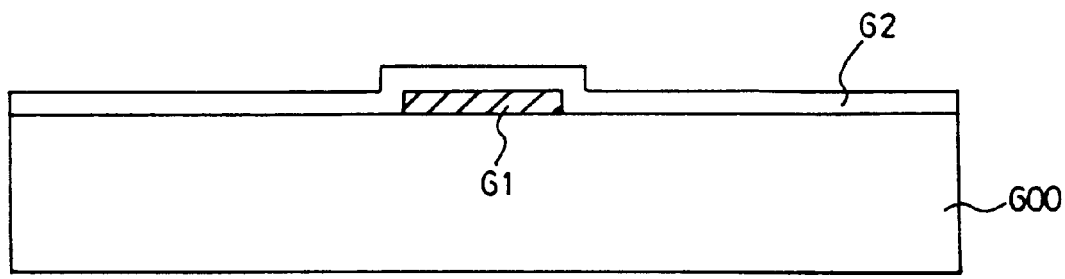
FIGS. 6A to 6E are schematic drawings of a TFT according to a second embodiment of the present invention.

Referring to FIG. 6A, an gate electrode 61 is formed on a insulating substrate 600. And a gate insulating interlayer 62 is deposited on the exposed surface of the substrate comprising the gate electrode. Here, the gate insulating interlayer 62 has steps and sloping surfaces, since the gate insulating interlayer covers the protruding gate electrode 61.

Figure 6B:
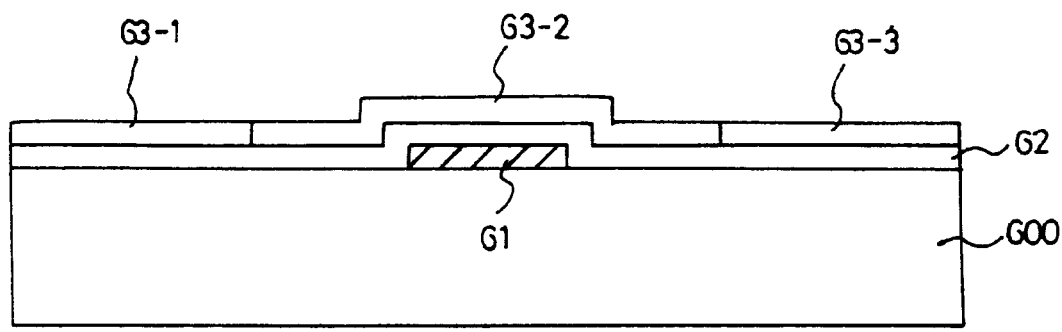

Referring to FIG. 6B, an amorphous silicon layer is deposited on the exposed gate insulating interlayer and is crystallized into a polycrystalline silicon layer 63 by an SLS technique described as the above. A crystallized silicon thin film 63 having a dramatically large first silicon grain 63-1, second silicon grain 63-2 and third silicon grain 63-3 are shown in FIG. 6B. The shape and translation distance of the laser beam must be controlled so that the boundaries of the grain to the grain are not located in an active layer of the TFT which will be formed.

During the above SLS technique process, it is necessary to use a laser beam having an energy density so as to melt the sloping surface as well as the flat surface of the amorphous silicon layer.

Figure 6C:
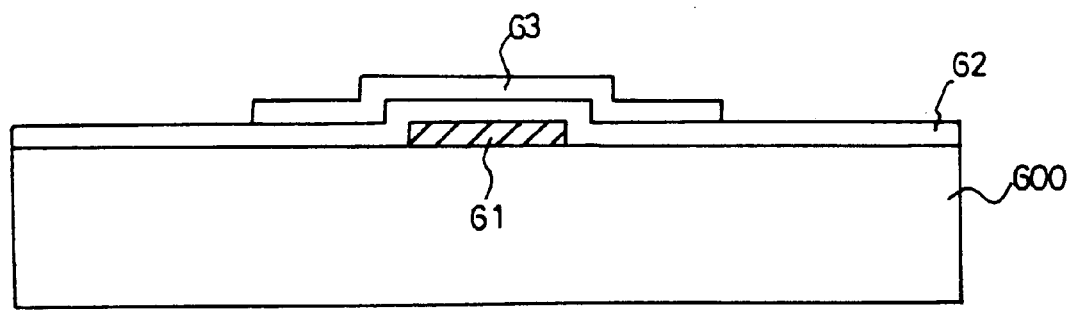

Referring to FIG. 6C, the crystallized silicon thin film is etched by photolithography to form an active layer 63. Since the first silicon grain, the second silicon grain and the third silicon grain are dramatically large, the active layer 63 is formed in one single silicon grain. Accordingly, a single crystalline silicon TFT can be fabricated on the insulating substrate, such as a glass substrate.

Figure 6D:
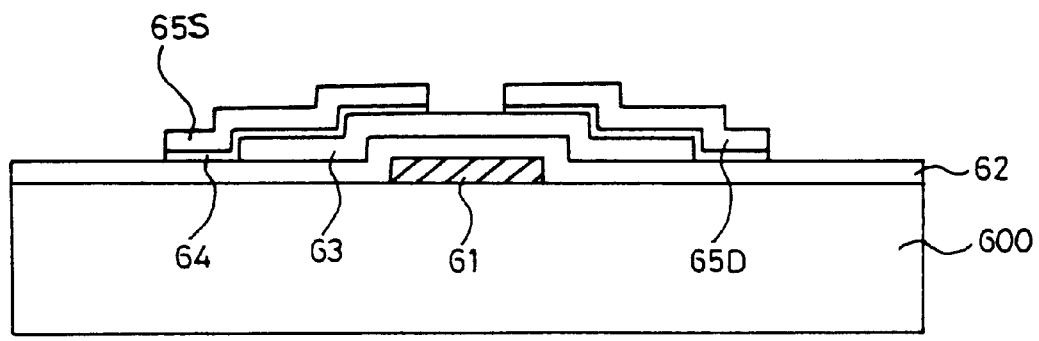
Figure 6E:
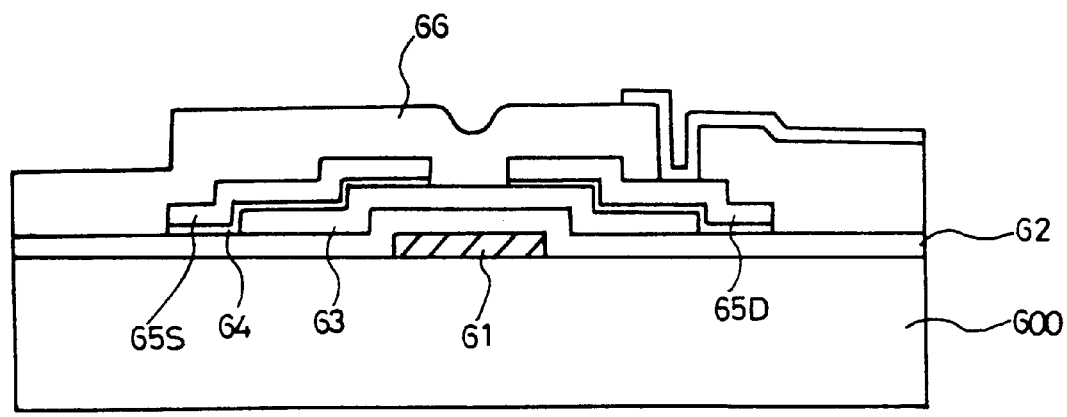

Referring to FIG. 6D, source and a drain electrodes 65S and 65D connect the active layer 63 electrically, thereby fabricating a stagger-type single crystalline silicon TFT on the substrate. Ohmic contact layers 64 are formed at the interface of the active layer and the source and drain electrodes. And a passivation layer 66 is deposited on the exposed surface of the substrate and is etched selectively to expose a portion of the drain electrode 65D. And a pixel electrode 67 is formed connecting the exposed portion of the drain electrode on the passivation layer.

According to the present invention, the polycrystalline silicon layer having large silicon grains are formed on the substrate by the SLS technique. The crystallized silicon layer is etched by photolithography to form the active layer of the TFT. Accordingly, co-planar or stagger-type single crystalline silicon TFT are formed on the substrate by the SLS technique.

The present invention enables one to fabricate a System-On-Panel (SOP)-type LCD, in which a pixel part, a driver, a controller and a CPU circuit are fabricated on the same substrate. The fabrication process is simplified and productivity is increased. Moreover, it is possible to fabricate a portable LCD product that is reduced in weight and size, since the space occupied by the controller and the CPU circuit is reduced.

It will be apparent to those skilled in the art that various modifications and variations can be made in an SOP-type liquid crystal display of the present invention without departing from the spirit or scope of the inventions. Thus, it is intended that the present invention will cover the modifications and variations of this invention provided they come within the scope of the appended claims and equivalents.

What is claimed is:

1. A method for fabricating a TFT having an active layer, comprising the steps of:
    crystallizing an amorphous silicon layer having a sloping surface and a flat surface by SLS technique using a laser beam having energy density to melt the sloping surface and the flat surface of the amorphous silicon layer for form a crystallized silicon layer, wherein the energy density of the laser beam required to melt the sloping surface is higher than that of the flat surface and the amorphous silicon layer is irradiated with the energy density to melt the sloping surface; and
    forming the active layer by selectively etching the crystallized silicon layer.

2. The method according to claim 1, wherein the TFT is a stagger typed TFT.

3. The method according to claim 1, wherein the TFT is an inverted stagger typed TFT.

4. The method according to claim 1, wherein the energy density of the laser beam required to substantially melt the sloping surface is proportional to the angle of the sloping surface with respect to the flat surface.

5. The method according to claim 1, wherein the sloping surface is about 45 degrees or less with respect to the flat surface.

6. The method according to claim 1, wherein the laser beam requires first energy density to substantially melt the sloping surface and second energy density to substantially melt the flat surface of the amorphous silicon, and wherein the amorphous silicon layer is irradiate with the laser beam having the first energy density.

7. The method according to claim 6, wherein the energy density of the laser beam required to substantially melt the sloping surface is proportional to the angle of the sloping surface with respect to the flat surface.

8. The method according to claim 6, wherein the sloping surface is about 45 degrees or less with respect to the flat surface.

9. A method for fabricating a TFT, comprising the steps of:
    forming source and drain electrodes on a substrate;
    depositing an amorphous silicon layer on the exposed portion of the substrate having the source and the drain electrodes, the amorphous silicon layer forming at least one sloping surface and one flat surface;
    crystallizing the amorphous silicon layer with a laser beam by using SLS technique, the laser beam having first energy density to melt the sloping surface and second energy density to melt the flat surface of the amorphous silicon, wherein the sloping surface is generated from the amorphous silicon layer covering at least one of the protruding source and the drain electrodes;
    forming an active layer by etching the crystallized silicon layer through photolithography;
    forming a gate electrode and a gate insulating layer on the active layer; and
    forming source and drain regions in the active layer by doping impurities selectively in the exposed portion of the active layer.

10. The method according to claim 9, wherein the energy density of the laser beam required to substantially melt the sloping surface is proportional to the angle of the sloping surface with respect to the flat surface.

11. The method according to claim 9, wherein the sloping surface is about 45 degrees or less with respect to the flat surface.

12. A method for fabricating a TFT, comprising the steps of:
    forming a gate electrode and a substrate;
    forming a gate insulating layer on the substrate comprising the gate electrode;
    depositing an amorphous silicon layer on the gate insulating layer, the amorphous silicon layer forming at least one sloping surface and one flat surface;
    crystallizing the amorphous silicon layer with a laser beam by using SLS technique, the laser beam having first energy density to melt the sloping surface and second energy density to melt the flat surface of the amorphous silicon;
    forming an active layer by etching the crystallized silicon layer through photolithography; and
    forming source and drain electrodes on the active layer.

13. The method according to claim 12, wherein the sloping surface is generated from the amorphous silicon layer covering the protruding gate electrode.

14. The method according to claim 12, wherein the energy density of the laser beam required to substantially melt the sloping surface is proportional to the angle of the sloping surface with respect to the flat surface.

15. The method according to claim 12, wherein the sloping surface is about 45 degrees or less with respect to the flat surface.

16. The method according to claim 12, wherein the energy density of the laser beam required to substantially melt the sloping surface is proportional to the angle of the sloping surface with respect to the flat surface.

17. The method according to claim 16, wherein the sloping surface is about 45 degrees or less with respect to the flat surface.

* * * * *